United States Patent
Gu et al.

(10) Patent No.: US 9,481,926 B2
(45) Date of Patent: Nov. 1, 2016

(54) VANADIUM OXIDE THERMO-SENSITIVE FILM MATERIAL WITH HIGH TEMPERATURE COEFFICIENT OF RESISTANCE AND A PREPARING METHOD THEREOF

(71) Applicant: University of Electronic Science and Technology of China, Chengdu, Sichuan (CN)

(72) Inventors: Deen Gu, Sichuan (CN); Tao Wang, Sichuan (CN); Yadong Jiang, Sichuan (CN)

(73) Assignee: University of Electronic Science and Technology of China, Chengdu, Sichuan (CN)

( * ) Notice: Subject to any disclaimer, the term of this patent is extended or adjusted under 35 U.S.C. 154(b) by 0 days.

(21) Appl. No.: 14/880,148

(22) Filed: Oct. 9, 2015

(65) Prior Publication Data

US 2016/0032443 A1     Feb. 4, 2016

(30) Foreign Application Priority Data

Jun. 12, 2015  (CN) .......................... 2015 1 0323617

(51) Int. Cl.
| | |
|---|---|
| C23C 14/08 | (2006.01) |
| C23C 14/35 | (2006.01) |
| C23C 14/00 | (2006.01) |
| C23C 14/34 | (2006.01) |
| H01B 1/02 | (2006.01) |
| C23C 14/58 | (2006.01) |
| C01G 31/02 | (2006.01) |

(52) U.S. Cl.
CPC ......... *C23C 14/083* (2013.01); *C23C 14/0036* (2013.01); *C23C 14/3464* (2013.01); *C23C 14/35* (2013.01); *C23C 14/352* (2013.01); *C23C14/58* (2013.01); *C23C 14/5853* (Continued)

(58) Field of Classification Search
CPC ................... C03C 2217/242; C03C 2217/218; C23C 14/35; C23C 14/083; C23C 14/0036; C23C 14/3464; C23C 14/58; C23C 14/5853; C23C 14/352; C01G 31/02
See application file for complete search history.

(56) References Cited

U.S. PATENT DOCUMENTS

| | | | |
|---|---|---|---|
| 2004/0155154 A1* | 8/2004 | Topping ............... | C03C 17/3411 244/171.7 |
| 2012/0171472 A1* | 7/2012 | Chang ................... | C04B 35/495 428/336 |
| 2012/0188628 A1* | 7/2012 | Chang ................... | C23C 14/352 359/288 |

OTHER PUBLICATIONS

Chen et al., "Electrochromism of vanadium oxide films doped by rare earth (Pr, Nd, Sm, Dy) oxides", Journal of electroanalytical Chemistry, vol. 559, 2003, pp. 83-86.*

(Continued)

*Primary Examiner* — Jonathan Langman

(57) ABSTRACT

A vanadium oxide thermo-sensitive film material with a high temperature coefficient of resistance (TCR) contains a rare earth element of Yttrium serving as a dopant in a preparation process. The vanadium oxide thermo-sensitive film material includes a substrate and a yttrium-doped vanadium oxide film layer. The yttrium-doped vanadium oxide film layer includes three elements of vanadium, oxygen and yttrium, wherein the atomic concentration of yttrium is at a range of 1%-8%, the atomic concentration of vanadium is at a range of 20-40% and the residue is oxygen. The method for preparing the vanadium oxide thermo-sensitive film material with high TCR includes a reactive magnetron sputtering method using a low-concentration yttrium-vanadium alloy target as a sputtering source or a reactive magnetron co-sputtering method using dual targets including a high-concentration yttrium-vanadium alloy target and a pure vanadium target as a co-sputtering source.

9 Claims, 3 Drawing Sheets

(52) U.S. Cl.
CPC ........ (2013.01); *H01B 1/02* (2013.01); *C01G 31/02* (2013.01)

(56) References Cited

OTHER PUBLICATIONS

Batista et al., "Synthesis and Characterization of VO2-based Thermochromic thin films for energy efficient windows", Nanoscale Research Letters, vol. 6, No. 301, 2011, pp. 1-7.*

Yang et al., "VOx films prepared by DC magnetron Sputtering", Chin. Opt. Lett., 2010, 08(s1): pp. 137-139.*

Brendt et al., "Structure and Catalytic Properties of VOx/MCM Materials for the Partial Oxidation of Methane to Formaldehyde", Journal of Catalysis, vol. 191, 2000, pp. 384-400.*

Li et al., "Methane Activation by Yttrium doped Vanadium Oxide Cluster Cations: Local Charge Effects", Chemistry A European journal, vol. 17, No. 42, 2011, pp. 11728-11733.*

* cited by examiner

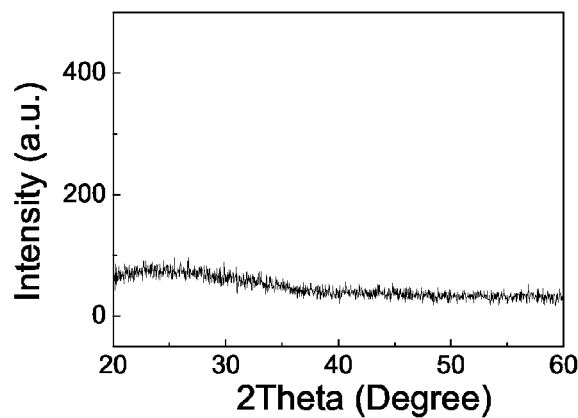
Fig. 1.1
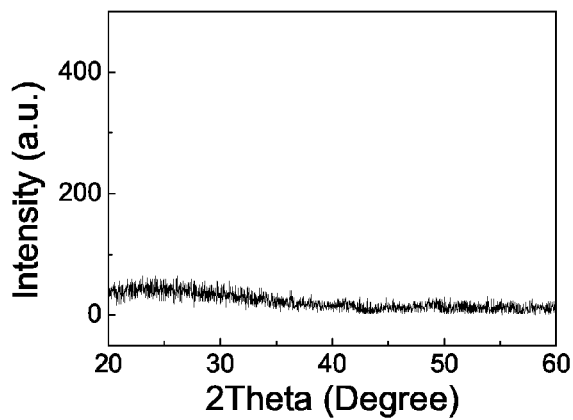
Fig. 1.2
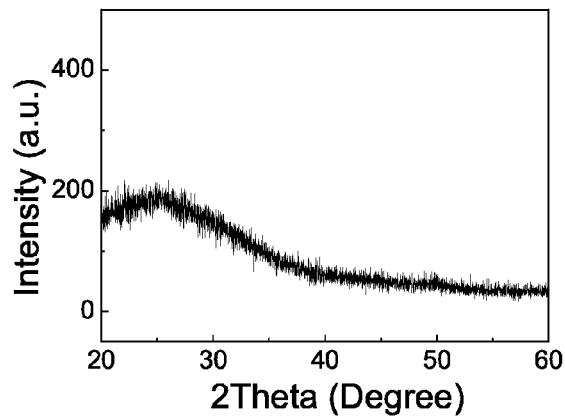
Fig. 1.3

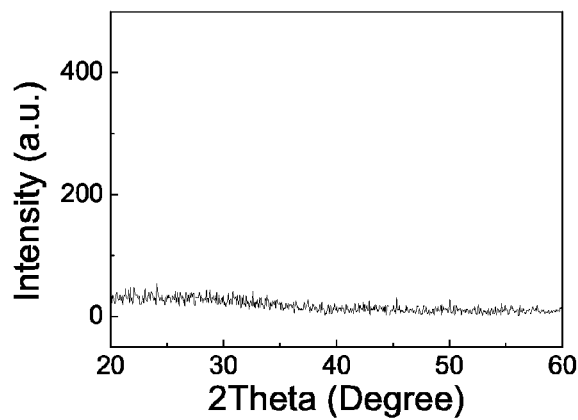
Fig. 2.1
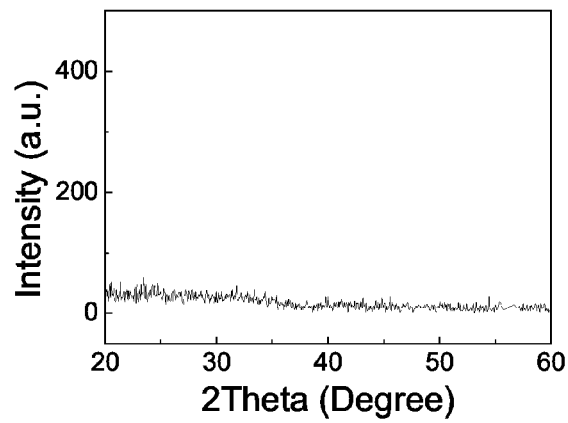
Fig. 2.2
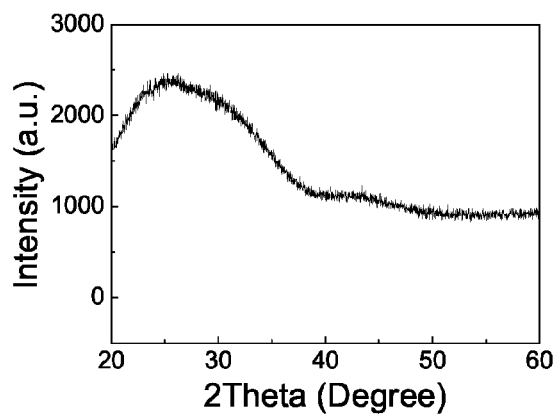
Fig. 2.3

VANADIUM OXIDE THERMO-SENSITIVE FILM MATERIAL WITH HIGH TEMPERATURE COEFFICIENT OF RESISTANCE AND A PREPARING METHOD THEREOF

CROSS REFERENCE OF RELATED APPLICATION

The present application claims priority under 35 U.S.C. 119(a-d) to CN 201520336988.9, filed Jun. 12, 2015.

BACKGROUND OF THE PRESENT INVENTION

1. Field of Invention

The present invention relates to the field of an infrared detector and an electronic material, and more particularly to a vanadium oxide thermo-sensitive film material with high temperature coefficient of resistance and a preparing method thereof.

2. Description of Related Arts

Due to advantages such as high temperature coefficient of resistance, low noise, good processing compatibility in Micro-Electro-Mechanical Systems (MEMS) and integrated circuit compatibility, vanadium oxide film is widely used as a thermo-sensitive material for high performance uncooled Focal Plane Array (UFPA). According to the noise theory of UFPA devices, the temperature coefficient of resistance (TCR) and the noise figure of the vanadium oxide thermo-sensitive film are two of main factors which influence sensitivity of the device. The higher the TCR of the vanadium oxide thermo-sensitive film, the smaller the noise figure, and accordingly the small the noise equivalent temperature difference (NETD) of the UFPA devices, i.e., the higher the sensitivity of the devices. In addition, the TCR of semiconductor materials is usually a negative value, and the values of TCR in the present invention are all referring to the absolute value of the TCR.

As an important metallic oxide semiconductor material, vanadium oxide is capable of forming up to 13 stable phases. Due to difference in atomic arrangement of each phase, the properties of vanadium oxide in different phases are greatly different, which causes a result that preparation of vanadium oxide thermo-sensitive film becomes one of the difficulties in high performance UFPAs. The commonly-used vanadium oxide thermo-sensitive film in UFPAs is mixed-valence vanadium oxide ($VO_x$) film, wherein the oxygen content has to meet a certain requirement to obtain an appropriate electrical resistivity and overall performance of the films, so as to assure a good performance of the devices. The mixed-valence vanadium oxide film usually has 2.0-2.5%/K TCR (R. A. Wood, et al., *IEEE*, 1992, 132-135; S. H. Black, et al., *Proc. of SPIE,* 2011, 8012, 80121A). However, the resistance stability of this kind of mixed-valence vanadium oxide film is poor. As a result, a passivation protection layer made of dielectric films such as SiNx is further required after the deposition of the mixed-valence vanadium oxide film, in order to avoid obvious changes of the resistance of the film during the interval of process-transfer or during the subsequent process. Moreover, the instability of the mixed-valence vanadium oxide film indicates a stricter requirement for the preparation process of the passivation protection layer, so as to avoid changes of the resistance of the mixed-valence vanadium oxide film during the deposition process of the passivation protection layer. All these conditions result in the difficulty of MEMS-process compatibility of manufacturing UFPAs.

Among the different phases of vanadium oxide, since TCR of $VO_2$ films in the semiconductor-metal phase transition region is over 16%/K, ones try to use $VO_2$ film with semiconductor-metal phase transition as the thermo-sensitive material for UFPAs, but the hysteresis phenomenon during the phase transition means a high thermal hysteresis noise. On the one hand, thermal hysteresis noise will apparently increase the noise of the UFPA device, thus decrease the signal-to-noise ratio. On the other hand, during the preparation process of UFPAs, the process temperature of several subsequent processes following the deposition of thermo-sensitive film, such as Plasma Enhanced Chemical Vapor Deposition (PECVD) process of the dielectric layer, the process for removing of photoresist, and the release process of sacrificial layer materials, is far larger than the phase-transition temperature of $VO_2$ film. This means that the $VO_2$ film will go through repeatedly phase transition during the device manufacturing process. The phase transition accompanies with the change of the volume of $VO_2$ films. As a result, the repeatedly volume changes will inevitably decrease the reliability of multi-layer films of the UFPA microbridge. Therefore, it is difficult for one to use $VO_2$ films as the thermo-sensitive material in the development of the UFPA devices with high performance.

Thus, in order to meet the demands of manufacturing the UFPAs with high performance, it is important to develop a new type vanadium oxide film material with high TCR, high resistance stability, no phase transition, and low noise.

The reference CN101552048A with a title "Yttrium-doped zinc oxide (ZnO:Y) transparent conductive film and a preparing method thereof" discloses that zinc oxide serves as host material and yttrium serves as dopant to prepare conducting film, so as to improve photoelectric property of the conducting film material. The present invention aims at the main problems of vanadium oxide thermo-sensitive film in the process of fabricating UFPA devices, and thus is different from the technical problems and the beneficial effects of yttrium serving as dopant in the reference. Furthermore, though yttrium-doping is applied in other oxide material, yttrium-doping is not disclosed for vanadium oxide host material.

SUMMARY OF THE PRESENT INVENTION

A technical solution to be solved by the present invention is to provide a new type yttrium-doped vanadium oxide thermo-sensitive film material having the characteristics of high TCR, good resistance stability, low noise figure and without phase transition, and a preparing method thereof. The preparing method is compatible with an MEMS process for preparing UFPAs, and is capable of being applied in manufacturing the UFPAs in batches.

Accordingly, in order to solve the technical problems stated above, the technical solutions adopted in the present invention are as follows.

A vanadium oxide thermo-sensitive film material with high TCR contains a rare earth element of Yttrium serving as a dopant in a preparation process. The vanadium oxide thermo-sensitive film material with high TCR comprises a substrate and a yttrium-doped vanadium oxide film layer; wherein the yttrium-doped vanadium oxide film layer comprises three elements of vanadium, oxygen and yttrium, wherein the atomic percentage content of yttrium atom is at a range of 1%-8%, the atomic percentage content of vanadium is at a range of 20-40%, and the residue is oxygen element. Preferably, the substrate is a silicon wafer with a SiNx film, a silicon wafer with $SiO_2$ film, K9 glass or $Al_2O_3$ substrate.

The vanadium oxide thermo-sensitive film material with high TCR is prepared using yttrium as a dopant. First technical solution is as follows.

A low-concentration yttrium-vanadium alloy target with yttrium atomic concentration of 2-12% serves as the sputtering source, the reactive magnetron sputtering method is adopted for preparing the vanadium oxide thermo-sensitive film material with high TCR, wherein specifically the method comprises following steps of:

(1) pre-heating a substrate in a vacuum at 100-250° C. for 30-150 minutes;

(2) under a flow ratio oxygen/argon flow ratio of 1:15-1:30, sputtering the low-concentration yttrium-vanadium alloy target for 3-10 minutes at a working pressure of 0.5-2.0 Pa;

(3) then under an oxygen/argon flow ratio of 1:15-1:30 and at a working pressure of 0.5-2.0 Pa, sputtering the low-concentration yttrium-vanadium alloy target and depositing yttrium-doped vanadium oxide film on the substrate pre-heated in the step (1), wherein deposition time depends on a specific deposition rate and a thickness of the yttrium-doped vanadium oxide film required to deposit; and (4) in an oxygen-enriched atmosphere, performing annealing treatment on the yttrium-doped vanadium oxide film deposited in the step (3), wherein an oxygen/argon flow ratio is 1:1-1:0, an atmospheric pressure in a vacuum chamber is 0.5-3.0 Pa, an annealing temperature is 150-280° C. and an annealing time is 30-150 minutes.

The substrate is a silicon wafer with a SiNx film, a silicon wafer with $SiO_2$ film, K9 glass or $Al_2O_3$ substrate.

The low-concentration yttrium-vanadium alloy target is fabricated by sintering in vacuum the compact formed using high purity vanadium powder and high purity yttrium powder. Preferably, the vanadium powder has a purity of 99.9% and the yttrium powder has a purity of 99.9%.

The vanadium oxide thermo-sensitive film material with high TCR is prepared using yttrium as a dopant. Second technical solution is as follows.

Dual targets comprising a high-concentration yttrium-vanadium alloy target with yttrium atomic concentration of 6-30% and a pure vanadium target serve as the sputtering source, the reactive magnetron co-sputtering method is adopted for preparing the yttrium-doped vanadium oxide film, wherein specifically the method for preparing the vanadium oxide thermo-sensitive film material with high TCR comprises following steps of:

(1) pre-heating a substrate in a vacuum at 100-250° C. for 30-150 minutes;

(2) under a flow ratio oxygen/argon flow ratio of 1:15-1:30, pre-sputtering the dual targets for 3-10 minutes at a working pressure of 0.5-2.0 Pa;

(3) then under an oxygen/argon flow ratio of 1:15-1:30 and at a working pressure of 0.5-2.0 Pa, sputtering the dual targets and depositing yttrium-doped vanadium oxide film on the substrate preheated in the step (1), wherein deposition time depends on a specific deposition rate and a thickness of the yttrium-doped vanadium oxide film required to deposit; and (4) in an oxygen-enriched atmosphere, performing annealing treatment on the yttrium-doped vanadium oxide film deposited in the step (3), wherein an oxygen/argon flow ratio is 1:1-1:0, an atmospheric pressure in a vacuum chamber is 0.5-3.0 Pa, an annealing temperature is 150-280° C. and an annealing time is 30-150 minutes.

Preferably, the substrate is a silicon wafer with a SiNx film, a silicon wafer with $SiO_2$ film, K9 glass or $Al_2O_3$ substrate.

The high-concentration yttrium-vanadium alloy target is fabricated by sintering in vacuum the compact formed using high purity vanadium powder and high purity yttrium powder. Preferably, the vanadium powder has a purity of 99.9% and the yttrium powder has a purity of 99.9%.

Beneficial effects of the present invention are as follows.

1. High TCR. The vanadium oxide film material prepared according to the method of the present invention has characteristic of high TCR of 3.3-3.8%/K, which is significantly higher than TCR (2.0-2.5%/K) of mixed-valence vanadium oxide film material, which is in favour of improving sensitivity of UFPA devices.

2. High resistance stability. The vanadium oxide film material prepared according to the method of the present invention has high environmental resistance stability, which is capable of greatly reducing the difficulty in the compatibility with the MEMS process of a UFPA device.

3. The XRD analysis proves that the vanadium oxide film material prepared according to the method of the present invention is amorphous, and temperature dependence of resistance thereof has no phase transition feature, which is capable of avoiding the thermal hysteresis noise existed in the $VO_2$ films.

4. The methods for preparing the vanadium oxide thermo-sensitive film material provided by the present invention are a reactive magnetron sputtering and a reactive magnetron co-sputtering of double targets. The methods of the present invention are easily achieved by the conventional sputtering tools or by properly modifying the conventional sputtering tools, and are compatible with the MEMS process of a UFPA device.

BRIEF DESCRIPTION OF THE DRAWINGS

In order to fully illustrate technical solutions of the present invention, brief description of the drawings in the preferred embodiments is illustrated as follows. One skilled in the art will understand that the FIGS. of the present invention as shown in the drawings and described above is exemplary only and not intended to be limiting.

FIG. 1.1, FIG. 1.2, FIG. 1.3, FIG. 2.1, FIG. 2.2 and FIG. 2.3 are respectively XRD (X-ray diffraction) patterns of yttrium-doped vanadium oxide thermo-sensitive film materials VYO-11, VYO-12, VYO-13, VYO-21, VYO-22 and VYO-23 which are respectively prepared in the example 1.1, 1.2, 1.3, 2.1, 2.2 and 2.3.

DETAILED DESCRIPTION OF THE PREFERRED EMBODIMENT

Figure 1:
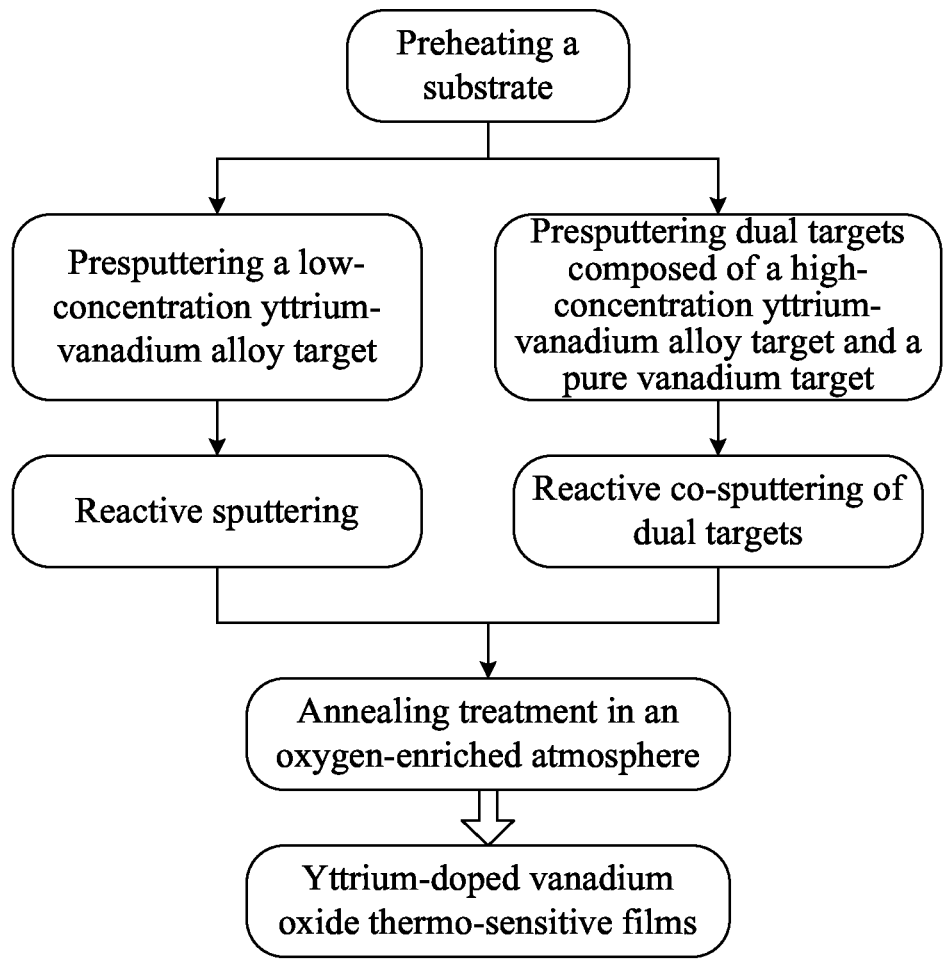
FIG. 1 is a sketch view of an overall flow chart of a preparing method for a vanadium oxide thermo-sensitive film material with high TCR.

Further description of the present invention is illustrated combining with the accompanying drawings and the preferred embodiments.

Technical Solution 1

Example 1.1

A silicon wafer having a film of 300 nm SiNx is preheated at 200° C. for 60 minutes in a sputtering chamber under a vacuum environment. Under an atmosphere of an oxygen/argon flow ratio of 1:20, a low-concentration yttrium-vanadium alloy target with a yttrium atomic concentration of 5.0% is pre-sputtered for 5 minutes at a working pressure of 1.5 Pa. Then under an atmosphere of an oxygen/argon flow ratio of 1:20, the pre-sputtered low-concentration yttrium-vanadium alloy target is sputtered and the yttrium-doped vanadium oxide film is deposited on the preheated silicon wafer with a film of 300 nm SiNx for 25 minutes. Then in an oxygen-enriched atmosphere with an oxygen/argon flow ratio of 1:0.2 and at a working pressure of 2.0 Pa, the deposited yttrium-doped vanadium oxide film is annealed for 100 minutes at 250° C. After the annealing treatment is finished, temperature is dropped to 100° C. below. Samples (denoted as VYO-11) are taken out for measurement.

Meanwhile, as a contrast embodiment, pure vanadium target (having a purity of 99.9%) is adopted as a sputtering source, other process conditions are identical to the example 1.1 to obtain undoped vanadium oxide film (denoted as VO-11).

At 28° C., 30° C. and 32° C., sheet resistance of film examples of VYO-11 and VO-11 are measured, respectively.

According to the formula (1), temperature coefficient of resistances (TCR) of the film examples of VYO-11 and VO-11 are respectively calculated.

$$TCR = \frac{R_{32°C.} - R_{29°C.}}{4 \times R_{30°C.}} \times 100\% \quad (1)$$

wherein $R_{32°C.}$, $R_{30°C.}$, and $R_{28°C.}$) present sheet resistances at 28° C., 30° C. and 32° C., respectively.

After storing for 72 hours in atmospheric environment and at room temperature, the sheet resistances of the film examples of VYO-11 and VO-11 are again measured at 28° C.

According to the formula (2), the relative rates of change of sheet resistances ($\Delta R/R_0$) of the film samples of the VYO-11 and VO-11 are calculated, respectively.

$$\Delta R/R_0 = \frac{R_{72h} - R_{0h}}{R_{0h}} \times 100\% \quad (2)$$

wherein $R_{0h}$ is an immediately-measured sheet resistance after preparation of a film, $R_{72h}$ is a sheet resistance measured after 72-hours storage from the preparation of the film.

The noise power spectra of the film example of VYO-11 and VO-11 are measured to obtain noise figure thereof, respectively. The results of calculation and measurement are shown in Table 1.1.

TABLE 1.1

Performance parameters of the yttrium-doped vanadium oxide film and the undoped vanadium oxide film which are respectively prepared in the example 1.1.

| Sample | |TCR| (%/K) | Relative rates of change of sheet resistances after 72 hours (%) | Noise figure |
|---|---|---|---|
| VO-11 | 2.4 | 16.3 | 3.2E−8 |
| VYO-11 | 3.7 | 1.5 | 2.5E−9 |

The result indicates that the yttrium-doped vanadium oxide film (VYO-11), compared with the undoped vanadium oxide film (VO-11), has a significant increase in both TCR and the sheet resistance stability, and has a decrease in the noise figure.

Furthermore, an XRD (X-Ray Diffraction) test is performed on the prepared samples of the yttrium-doped vanadium oxide film (VYO-11). As shown in FIG. 1.1, the yttrium-doped vanadium oxide film (VYO-11) has no apparent diffraction peak, i.e., the yttrium-doped vanadium oxide film VYO-11 is amorphous. Percentage contents of all elements of the yttrium-doped vanadium oxide film VYO-11, which are tested by EDS (energy-dispersive spectrometry), are as follows: yttrium 5.2%, vanadium 32.1% and oxygen 62.7%, respectively.

Example 1.2

A silicon wafer having a film of 300 nm SiNx is preheated at 100° C. for 30 minutes in a sputtering chamber under a vacuum environment. Under an atmosphere of an oxygen/argon flow ratio of 1:15, a low-concentration yttrium-vanadium alloy target with a yttrium atomic concentration of 2.0% is pre-sputtered for 3 minutes at a working pressure of 0.5 Pa. Then under an atmosphere of an oxygen/argon flow ratio of 1:20, the pre-sputtered low-concentration yttrium-vanadium alloy target is sputtered and the yttrium-doped vanadium oxide film is deposited on the preheated silicon wafer with a film of 300 nm SiNx for 25 minutes. Then in an oxygen-enriched atmosphere with an oxygen/argon flow ratio of 1:1 and at a working pressure of 0.5 Pa, the deposited yttrium-doped vanadium oxide film is annealed for 30 minutes at 150° C. After the annealing treatment is finished, temperature is dropped to 100° C. below. Samples (denoted as VYO-12) are taken out for measurement.

Meanwhile, as a contrast embodiment, pure vanadium target (having a purity of 99.9%) is adopted as a sputtering source, other process conditions are identical to the example 1.2 to obtain undoped vanadium oxide film (denoted as VO-12).

At 28° C., 30° C. and 32° C., sheet resistance of film examples of VYO-12 and VO-12 are measured, respectively. According to the formula (1) shown in the example 1.1, TCRs of the film examples of VYO-12 and VO-12 are calculated, respectively.

After storing for 72 hours in atmospheric environment and at room temperature, the sheet resistances of the film examples of VYO-12 and VO-12 are again measured at 28° C. According to the formula (2) shown in the example 1.1, the relative rates of change of sheet resistances ($\Delta R/R_0$) of the film samples of VYO-12 and VO-12 are calculated, respectively.

The noise power spectra of the film example of VYO-12 and VO-12 are measured to obtain noise figure thereof, respectively. The results of calculation and measurement are shown in Table 1.2.

TABLE 1.2

Performance parameters of the yttrium-doped vanadium oxide film and the undoped vanadium oxide film which are respectively prepared in the example 1.2.

| Sample | |TCR| (%/K) | Relative rates of change of sheet resistances after 72 hours (%) | Noise figure |
|---|---|---|---|
| VO-12 | 2.5 | 17.5 | 5.1E−8 |
| VYO-12 | 3.4 | −0.6 | 4.7E−9 |

The result indicates that the yttrium-doped vanadium oxide film (VYO-12), compared with the undoped vanadium oxide film (VO-12), has a significant increase in both TCR and the sheet resistance stability, and has a decrease in the noise figure.

Furthermore, an XRD (X-Ray Diffraction) test is performed on the prepared samples of the yttrium-doped vanadium oxide film (VYO-12). As shown in FIG. 1.2, the yttrium-doped vanadium oxide film (VYO-12) has no apparent diffraction peak, i.e., the yttrium-doped vanadium oxide film VYO-12 is amorphous. Percentage contents of all elements of the yttrium-doped vanadium oxide film VYO-12, which are tested by EDS (energy-dispersive spectrometry), are as follows: yttrium 2.6%, vanadium 33.6% and oxygen 63.8%, respectively.

Example 1.3

A silicon wafer having a film of 300 nm SiNx is preheated at 250° C. for 150 minutes in a sputtering chamber under a vacuum environment. Under an atmosphere of an oxygen/argon flow ratio of 1:30, a low-concentration yttrium-vanadium alloy target with a yttrium atomic concentration of 12.0% is pre-sputtered for 10 minutes at a working pressure of 2.0 Pa. Then under an atmosphere of an oxygen/argon flow ratio of 1:30, the pre-sputtered low-concentration yttrium-vanadium alloy target is sputtered and the yttrium-doped vanadium oxide film is deposited on the preheated silicon wafer with a film of 300 nm SiNx for 25 minutes. Then in an oxygen-enriched atmosphere with an oxygen/argon flow ratio of 1:0 and at a working pressure of 3.0 Pa, the deposited yttrium-doped vanadium oxide film is annealed for 150 minutes at 280° C. After the annealing treatment is finished, temperature is dropped to 100° C. below. Samples (denoted as VYO-13) are taken out for measurement.

Meanwhile, as a contrast embodiment, pure vanadium target (having a purity of 99.9%) is adopted as a sputtering source, other process conditions are identical to the example 1.3 to obtain undoped vanadium oxide film (denoted as VO-13).

At 28° C., 30° C. and 32° C., sheet resistance of film examples of VYO-13 and VO-13 are tested, respectively. According to the formula (1) shown in the example 1.1, TCRs of the film examples of VYO-13 and VO-13 are calculated, respectively.

After storing for 72 hours in atmospheric environment and at room temperature, the sheet resistances of the film examples of VYO-13 and VO-13 are again measured at 28° C. According to the formula (2) in the example 1.1, the relative rates of change of sheet resistances ($\Delta R/R_0$) of the film samples of VYO-13 and VO-13 are calculated, respectively.

The noise power spectra of the film example of VYO-13 and VO-13 are measured to obtain noise figure thereof, respectively. The results of calculation and measurement are shown in Table 1.3.

TABLE 1.3

Performance parameters of the yttrium-doped vanadium oxide film and the undoped vanadium oxide film which are respectively prepared in the example 1.3.

| Sample | \|TCR\| (%/K) | Relative rates of change of sheet resistances after 72 hours (%) | Noise figure |
|---|---|---|---|
| VO-13 | 2.3 | 15.9 | 6.2E−8 |
| VYO-13 | 3.8 | 1.1 | 1.8E−9 |

The result indicates that the yttrium-doped vanadium oxide film (VYO-13), compared with the undoped vanadium oxide film (VO-13), has a significant increase in both TCR and the sheet resistance stability, and has a decrease in the noise figure.

Furthermore, an XRD (X-Ray Diffraction) test is performed on the prepared samples of the yttrium-doped vanadium oxide film (VYO-13). As shown in FIG. 1.3, the yttrium-doped vanadium oxide film (VYO-13) has no apparent diffraction peak, i.e., the yttrium-doped vanadium oxide film VYO-13 is amorphous. Percentage contents of all elements of the yttrium-doped vanadium oxide film VYO-13, which are tested by EDS (energy-dispersive spectrometry), are as follows: yttrium 6.3%, vanadium 26.1% and oxygen 67.6%, respectively.

Technical Solution 2

Example 2.1

A silicon wafer having a film of 300 nm SiNx is preheated at 200° C. for 60 minutes in a sputtering chamber under a vacuum environment. Under an atmosphere of an oxygen/argon flow ratio of 1:20, dual targets comprising a high-concentration yttrium-vanadium alloy target with a yttrium atomic concentration of 15.0% and a pure vanadium target are pre-sputtered for 5 minutes at a working pressure of 1.5 Pa. Then under an atmosphere of an oxygen/argon flow ratio of 1:20, pre-sputtered dual targets are co-sputtered and the yttrium-doped vanadium oxide film is deposited on the preheated silicon wafer with a film of 300 nm SiNx for 25 minutes. Then in an oxygen-enriched atmosphere with an oxygen/argon flow ratio of 1:0.2 and at a working pressure of 2.0 Pa, the deposited yttrium-doped vanadium oxide film is annealed for 100 minutes at 250° C. After the annealing treatment is finished, temperature is dropped to 100° C. below. Samples (denoted as VYO-21) are taken out for measurement.

Meanwhile, as a contrast embodiment, pure vanadium target (having a purity of 99.9%) is adopted as a sputtering source, other process conditions are identical to the example 2.1 to obtain undoped vanadium oxide film (denoted as VO-21).

At 28° C., 30° C. and 32° C., sheet resistance of film examples of VYO-21 and VO-21 are tested, respectively. According to the formula (1) shown in the example 1.1, TCRs of the film samples of VYO-21 and VO-21 are calculated, respectively.

After storing for 72 hours in atmospheric environment and at room temperature, the sheet resistances of the film examples of VYO-21 and VO-21 are again measured at 28° C. According to the formula (2) in the example 1.1, the relative rates of change of sheet resistances ($\Delta R/R_0$) of the film samples of the VYO-21 and VO-21 are calculated, respectively.

The noise power spectra of the film example of VYO-21 and VO-21 are measured to obtain noise figure thereof, respectively. The results of calculation and measurement are shown in Table 2.1.

TABLE 2.1

Performance parameters of the yttrium-doped vanadium oxide film and the undoped vanadium oxide film which are respectively prepared in the example 2.1

| Sample | \|TCR\| (%/K) | Relative rates of change of sheet resistances after 72 hours (%) | Noise figure |
|---|---|---|---|
| VO-21 | 2.5 | 16.9 | 7.5E−8 |
| VYO-21 | 3.6 | −1.2 | 3.6E−9 |

The result indicates that the yttrium-doped vanadium oxide film (VYO-21), compared with the undoped vanadium oxide film (VO-21), has a significant increase in both TCR and the sheet resistance stability, and has a decrease in the noise figure.

Furthermore, an XRD (X-Ray Diffraction) test is performed on the prepared samples of the yttrium-doped vanadium oxide film (VYO-21). As shown in FIG. 2.1, the yttrium-doped vanadium oxide film (VYO-21) has no apparent diffraction peak, i.e., the yttrium-doped vanadium oxide film VYO-21 is amorphous. Percentage contents of all elements of the yttrium-doped vanadium oxide film VYO-21, which are tested by EDS (energy-dispersive spectrometry), are as follows: yttrium 4.5%, vanadium 31.3% and oxygen 64.2%, respectively.

Example 2.2

A silicon wafer having a film of 300 nm SiNx is preheated at 100° C. for 30 minutes in a sputtering chamber under a vacuum environment. Under an atmosphere of an oxygen/argon flow ratio of 1:15, dual targets comprising a high-concentration yttrium-vanadium alloy target with a yttrium atomic concentration of 6.0% and a pure vanadium target are pre-sputtered for 10 minutes at a working pressure of 0.5 Pa. Then under an atmosphere of an oxygen/argon flow ratio of 1:20, pre-sputtered dual targets are co-sputtered and the yttrium-doped vanadium oxide film is deposited on the preheated silicon wafer with a film of 300 nm SiNx for 25 minutes. Then in an oxygen-enriched atmosphere with an oxygen/argon flow ratio of 1:1 and at a working pressure of 0.5 Pa, the deposited yttrium-doped vanadium oxide film is annealed for 30 minutes at 150° C. After the annealing treatment is finished, temperature is dropped to 100° C. below. Samples (denoted as VYO-22) are taken out for measurement.

Meanwhile, as a contrast embodiment, pure vanadium target (having a purity of 99.9%) is adopted as a sputtering source, other process conditions are identical to the example 2.2 to obtain undoped vanadium oxide film (denoted as VO-22).

At 28° C., 30° C. and 32° C., sheet resistance of film examples of VYO-22 and VO-22 are tested, respectively. According to the formula (1) shown in the example 1.1, TCRs of the film examples of VYO-22 and VO-22 are calculated, respectively.

After storing for 72 hours in atmospheric environment and at room temperature, the sheet resistances of the film examples of VYO-22 and VO-22 are again measured at 28° C. According to the formula (2) in the example 1.1, the relative rates of change of sheet resistances ($\Delta R/R_0$) of the film samples of the VYO-22 and VO-22 are calculated, respectively.

The noise power spectra of the film example of VYO-22 and VO-22 are measured to obtain noise figure thereof, respectively. The results of calculation and measurement are shown in Table 2.2.

TABLE 2.2

Performance parameters of the yttrium-doped vanadium oxide film and the undoped vanadium oxide film which are respectively prepared in the example 2.2

| Sample | |TCR| (%/K) | Relative rates of change of sheet resistances after 72 hours (%) | Noise figure |
|---|---|---|---|
| VO-22 | 2.2 | 17.1 | 6.1E−8 |
| VYO-22 | 3.3 | 1.5 | 3.8E−9 |

The result indicates that the yttrium-doped vanadium oxide film (VYO-22), compared with the undoped vanadium oxide film (VO-22), has a significant increase in both TCR and the sheet resistance stability, and has a decrease in the noise figure.

Furthermore, an XRD (X-Ray Diffraction) test is performed on the prepared samples of the yttrium-doped vanadium oxide film (VYO-22). As shown in FIG. 2.2, the yttrium-doped vanadium oxide film (VYO-22) has no apparent diffraction peak, i.e., the yttrium-doped vanadium oxide film VYO-22 is amorphous. Percentage contents of all elements of the yttrium-doped vanadium oxide film VYO-22, which are tested by EDS (energy-dispersive spectrometry), are as follows: yttrium 1.6%, vanadium 35.2% and oxygen 63.2%, respectively.

Example 2.3

A silicon wafer having a film of 300 nm SiNx is preheated at 250° C. for 150 minutes in a sputtering chamber under a vacuum environment. Under an atmosphere of an oxygen/argon flow ratio of 1:30, dual targets comprising a high-concentration yttrium-vanadium alloy target with a yttrium atomic concentration of 30.0% and a pure vanadium target are pre-sputtered for 10 minutes at a working pressure of 2.0 Pa. Then under an atmosphere of an oxygen/argon flow ratio of 1:30, pre-sputtered dual targets are co-sputtered and the yttrium-doped vanadium oxide film is deposited on the preheated silicon wafer with a film of 300 nm SiNx for 25 minutes. Then in an oxygen-enriched atmosphere with an oxygen/argon flow ratio of 1:0 and at a working pressure of 3.0 Pa, the deposited yttrium-doped vanadium oxide film is annealed for 150 minutes at 280° C. After the annealing treatment is finished, temperature is dropped to 100° C. below. Samples (denoted as VYO-23) are taken out for measurement.

Meanwhile, as a contrast embodiment, pure vanadium target (having a purity of 99.9%) is adopted as a sputtering source, other process conditions are identical to the example 2.3 to obtain undoped vanadium oxide film (denoted as VO-23).

At 28° C., 30° C. and 32° C., sheet resistance of film examples of VYO-23 and VO-23 are respectively tested. According to the formula (1) shown in the example 1.1, TCRs of the film examples of VYO-23 and VO-23 are calculated, respectively.

After storing for 72 hours in atmospheric environment and at room temperature, the sheet resistances of the film examples of VYO-23 and VO-23 are again measured at 28° C. According to the formula (2) in the example 1.1, the relative rates of change of sheet resistances ($\Delta R/R_0$) of the film samples of the VYO-23 and VO-23 are calculated, respectively.

The noise power spectra of the film example of VYO-23 and VO-23 are measured to obtain noise figure thereof, respectively. The results of calculation and measurement are shown in Table 2.3.

TABLE 2.3

Performance parameters of the yttrium-doped vanadium oxide film and the undoped vanadium oxide film which are respectively prepared in the example 2.3

| Sample | |TCR| (%/K) | Relative rates of change of sheet resistances after 72 hours (%) | Noise figure |
|---|---|---|---|
| VO-23 | 2.5 | 16.2 | 8.3E−8 |
| VYO-23 | 3.8 | −1.3 | 2.7E−9 |

The result indicates that the yttrium-doped vanadium oxide film (VYO-23), compared with the undoped vanadium oxide film (VO-23), has a significant increase in both TCR and the sheet resistance stability, and has a decrease in the noise figure.

Furthermore, an XRD (X-Ray Diffraction) test is performed on the prepared samples of the yttrium-doped vanadium oxide film (VYO-23). As shown in FIG. 2.3, the yttrium-doped vanadium oxide film (VYO-23) has no apparent diffraction peak, i.e., the yttrium-doped vanadium oxide film VYO-23 is amorphous. Percentage contents of all elements of the yttrium-doped vanadium oxide film VYO-23, which are tested by EDS (energy-dispersive spectrometry), are as follows: yttrium 6.9%, vanadium 25.2% and oxygen 67.9%, respectively.

It will thus be seen that the objects of the present invention have been fully and effectively accomplished. Its embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A method for preparing a vanadium oxide thermo-sensitive film material with high TCR, comprising:
    adding a rare element of yttrium for serving as a dopant, wherein a low-concentration yttrium-vanadium alloy target or dual targets comprising a high concentration yttrium-vanadium alloy target and a pure vanadium target serve as a sputtering source, a reactive magnetron sputtering method is adopted for preparing the vanadium oxide thermo-sensitive film material with high TCR.

2. The method for preparing the vanadium oxide thermo-sensitive film material with high TCR, as recited in claim 1, wherein the low-concentration yttrium-vanadium alloy target serves as the sputtering source, the reactive magnetron sputtering method is adopted for preparing the vanadium oxide thermo-sensitive film material with high TCR, wherein specifically the method for preparing the vanadium oxide thermo-sensitive film material with high TCR comprises following steps of:
    (1) preheating a substrate in a vacuum at 100-250° C. for 30-150 minutes;
    (2) under a flow ratio oxygen/argon flow ratio of 1:15-1:30, sputtering the low-concentration yttrium-vanadium alloy target for 3-10 minutes at a working pressure of 0.5-2.0 Pa;
    (3) then under an oxygen/argon flow ratio of 1:15-1:30 and at a working pressure of 0.5-2.0 Pa, sputtering the low-concentration yttrium-vanadium alloy target and depositing the yttrium-doped vanadium oxide film on the substrate preheated in the step (1), wherein deposition time depends on a specific deposition rate and a thickness of the yttrium-doped vanadium oxide film required to deposit; and
    (4) in an oxygen-enriched atmosphere, performing annealing treatment on the yttrium-doped vanadium oxide film deposited in the step (3), wherein an oxygen/argon flow ratio is 1:1-1:0, an atmospheric pressure in a vacuum chamber is 0.5-3.0 Pa, an annealing temperature is 150-280° C. and an annealing time is 30-150 minutes.

3. The method for preparing the vanadium oxide thermo-sensitive film material with high TCR, as recited in claim 2, wherein the low-concentration yttrium-vanadium alloy target is fabricated by sintering in vacuum the compact formed using vanadium powder with a purity of 99.9% and yttrium powder with a purity of 99.9%, wherein a yttrium atomic concentration of the low-concentration yttrium-vanadium alloy target is at a range of 2-12%.

4. The method for preparing the vanadium oxide thermo-sensitive film material with high TCR, as recited in claim 1, wherein the dual targets comprise a high-concentration yttrium-vanadium alloy target and a pure vanadium target serve as the sputtering source, the reactive magnetron sputtering method is adopted for preparing the yttrium-doped vanadium oxide film, wherein specifically the method for preparing the vanadium oxide thermo-sensitive film material with high TCR comprises following steps of:
    (1) preheating a substrate in a vacuum at 100-250° C. for 30-150 minutes;
    (2) under a flow ratio oxygen/ argon flow ratio of 1:15-1:30, pre-sputtering the dual targets for 3-10 minutes at a working pressure of 0.5-2.0 Pa;
    (3) then under an oxygen/argon flow ratio of 1:15-1:30 and at a working pressure of 0.5-2.0 Pa, sputtering the dual targets and depositing yttrium-doped vanadium oxide film on the substrate preheated in the step (1), wherein deposition time depends on a specific deposition rate and a thickness of the yttrium-doped vanadium oxide film required to deposit; and
    (4) in an oxygen-enriched atmosphere, performing annealing treatment on the yttrium-doped vanadium oxide film deposited in the step (3), wherein an oxygen/argon flow ratio is 1:1-1:0, an atmospheric pressure in a vacuum chamber is 0.5-3.0 Pa, an annealing temperature is 150-280° C. and an annealing time is 30-150 minutes.

5. The method for preparing the vanadium oxide thermo-sensitive film material with high TCR, as recited in claim 4, wherein the high-concentration yttrium-vanadium alloy target is fabricated by sintering in vacuum the compact formed using vanadium powder with a purity of 99.9% and yttrium powder with a purity of 99.9%, wherein a yttrium atomic concentration of the high-concentration yttrium-vanadium alloy target is at a range of 6-30%.

6. The method for preparing the vanadium oxide thermo-sensitive film material with high TCR, as recited in claim 2, wherein the substrate is a silicon wafer with a SiNx film, a silicon wafer with $SiO_2$ film, K9 glass or $Al_2O_3$ substrate.

7. The method for preparing the vanadium oxide thermo-sensitive film material with high TCR, as recited in claim 3, wherein the substrate is a silicon wafer with a SiNx film, a silicon wafer with $SiO_2$ film, K9 glass or $Al_2O_3$ substrate.

8. The method for preparing the vanadium oxide thermo-sensitive film material with high TCR, as recited in claim 4, wherein the substrate is a silicon wafer with a SiNx film, a silicon wafer with $SiO_2$ film, K9 glass or $Al_2O_3$ substrate.

9. The method for preparing the vanadium oxide thermo-sensitive film material with high TCR, as recited in claim 5, wherein the substrate is a silicon wafer with a SiNx film, a silicon wafer with $SiO_2$ film, K9 glass or $Al_2O_3$ substrate.

* * * * *